(12) United States Patent
Alford (10) Patent No.: US 9,264,020 B2
(45) Date of Patent: *Feb. 16, 2016

(54) SYSTEMS AND METHODS FOR IMPROVING THE TIME ALIGNMENT OF NON-OVERLAPPING WAVEFORMS

(71) Applicant: CSR Technology Inc., Sunnyvale, CA (US)

(72) Inventor: Ronald C. Alford, Phoenix, AZ (US)

(73) Assignee: CSR Technology Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/945,901

(22) Filed: Jul. 19, 2013

(65) Prior Publication Data

US 2014/0057586 A1   Feb. 27, 2014

Related U.S. Application Data

(63) Continuation of application No. 13/360,079, filed on Jan. 27, 2012, now Pat. No. 8,515,381.

(51) Int. Cl.
*H04B 1/26* (2006.01)
*H03K 3/017* (2006.01)
*H03B 27/00* (2006.01)
*H03D 7/16* (2006.01)
*H04B 1/16* (2006.01)
*H04B 1/28* (2006.01)

(52) U.S. Cl.
CPC ............. *H03K 3/017* (2013.01); *H03B 27/00* (2013.01); *H03D 7/165* (2013.01); *H04B 1/16* (2013.01)

(58) Field of Classification Search
CPC ............................ H04B 1/30; H03D 7/1441
USPC ............ 455/76, 165.1, 183.1, 323; 331/1 A
See application file for complete search history.

(56) References Cited

U.S. PATENT DOCUMENTS

| 4,018,122 A * | 4/1977 | Van Der Kooij ............. 84/635 |
| 8,515,381 B1 * | 8/2013 | Alford ........................ 455/323 |
| 2004/0263265 A1 * | 12/2004 | Allen et al. ................... 331/57 |

* cited by examiner

*Primary Examiner* — Lee Nguyen
(74) *Attorney, Agent, or Firm* — Procopio, Cory, Hargreaves & Savitch LLP (57) ABSTRACT

Systems and methods for improving the timing alignment of non-overlapping waveforms are provided. In this regard, a representative system, among others, includes a waveform synthesizer that generates a plurality of input waveforms and inverters having inputs and outputs, wherein the inverters receive the input waveforms at the inputs of the inverters and invert the input waveforms, producing a plurality of inverted waveforms at the outputs of the inverters. The system also includes NOR gates having inputs and outputs, wherein the NOR gates receive the plurality of inverted waveforms at the inputs of the NOR gates and pass through one of the inverted waveforms at the outputs of the NOR gates.

20 Claims, 9 Drawing Sheets

| Input of NOR Gate 305A ||| Output of LO_0 |
| --- | --- | --- | --- |
| LO_90 | LO_180 | LO_270 | |
| 0 | 0 | 0 | 1 |
| 0 | 1 | 0 | 0 |
| 1 | 0 | 0 | 0 |
| 1 | 1 | 0 | 0 |
| 0 | 0 | 1 | 0 |
| 0 | 1 | 1 | 0 |
| 1 | 0 | 1 | 0 |
| 1 | 1 | 1 | 0 |

SYSTEMS AND METHODS FOR IMPROVING THE TIME ALIGNMENT OF NON-OVERLAPPING WAVEFORMS

CROSS REFERENCE TO RELATED APPLICATIONS

This application is a continuation of copending U.S. utility application entitled, "SYSTEMS AND METHODS FOR IMPROVING 25% DUTY CYCLE SWITCHING MIXER LOCAL OSCILLATOR TIMING," having Ser. No. 13/360,079, filed on Jan. 27, 2012, which is entirely incorporated herein by reference.

TECHNICAL FIELD

The present disclosure is generally related to frequency conversion mixers and, more particularly, is related to systems and methods for improving the time alignment of non-overlapping waveforms.

BACKGROUND

Figure 1:
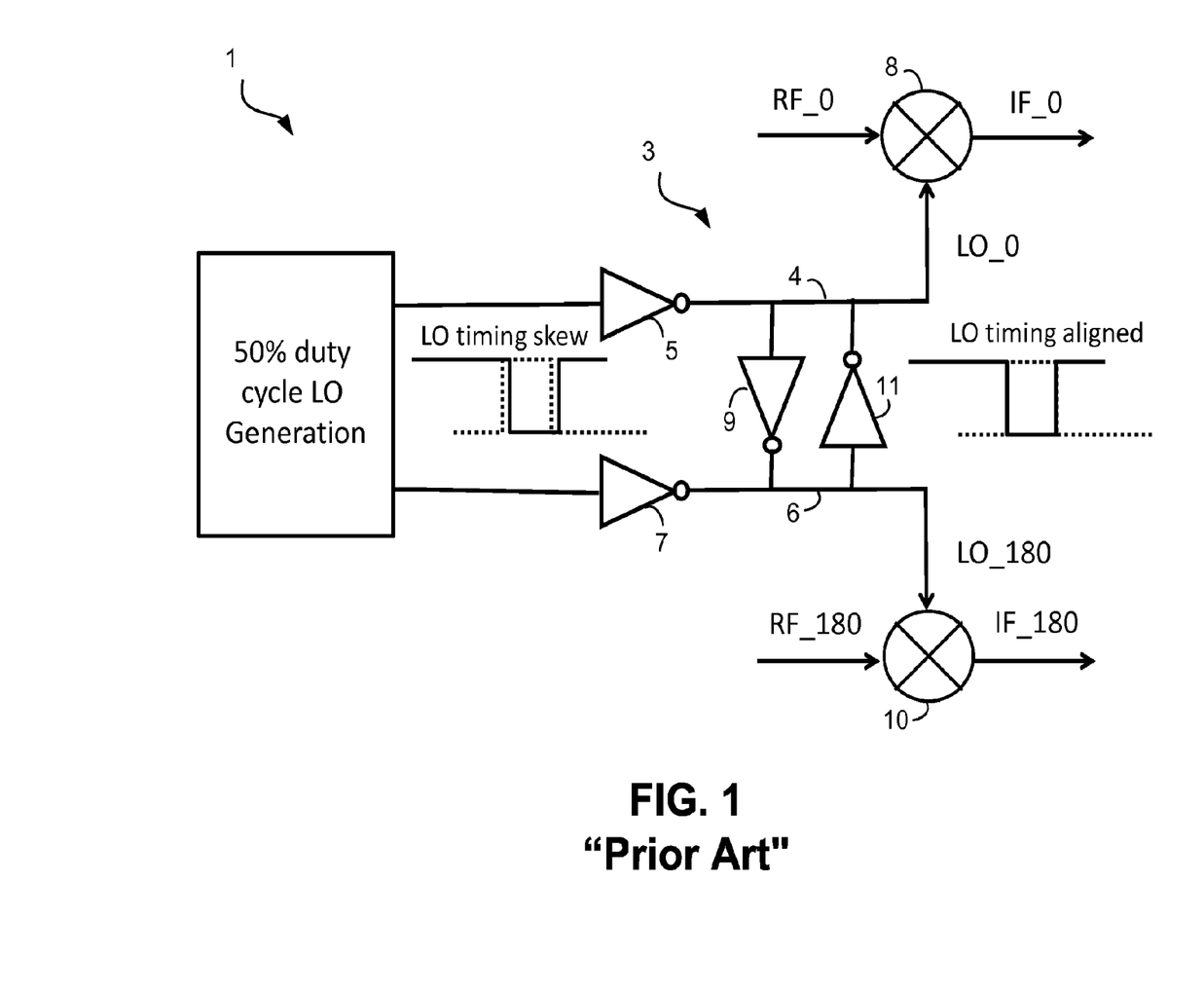
FIG. 1 depicts cross-coupled inverters that are used to de-skew differential local oscillator (LO) clock waveforms prior to mixers for 50% duty cycle LO waveforms.

Cross-coupled inverters 9, 11 have been used in pseudo-differential inverter strings to generate a differential set of transitions in otherwise uncoupled single-ended complementary metal-oxide-semiconductor (CMOS) signal paths, such as that shown in FIG. 1. The circuit arrangement 3 of the cross-coupled inverters 9, 11 insures that a time skew in either the top or bottom differential pair of signals is not allowed to propagate. The cross-coupled inverters 9, 11 are used to de-skew differential local oscillator (LO) clock waveforms prior to mixers 8, 10 for 50% duty cycle LO waveforms. Inverters 5 & 7 are inverter buffers in the forward path of the circuit arrangement 3.

Figure 2:
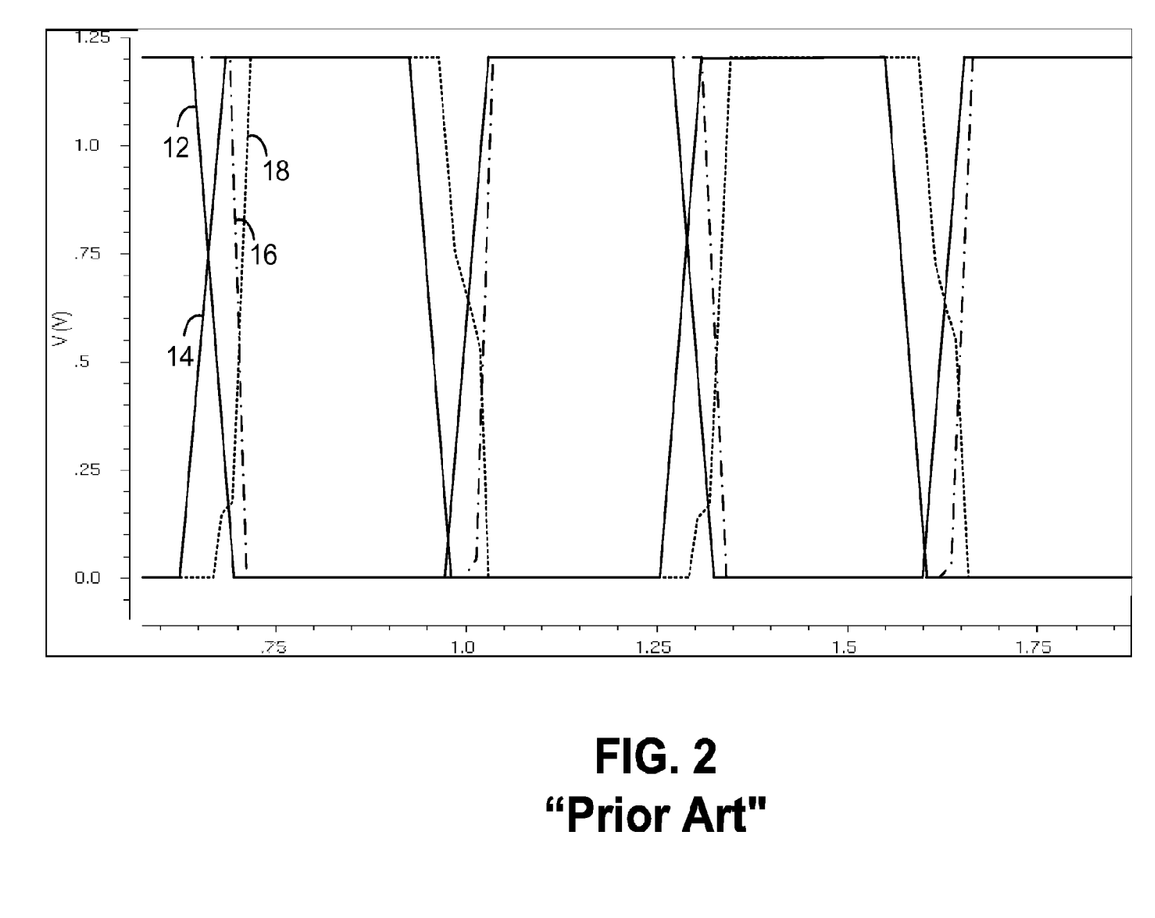
FIG. 2 depicts input waveforms that are de-skewed by cross-coupled inverters.

The circuit arrangement 3 of the cross-coupled inverters 9, 11 de-skews input waveforms 12 at outputs 4, 6 by cross-coupled inverters 9, 11. The de-skewed waveforms are shown in FIG. 2. As demonstration, the waveforms 12, 14 are pseudo-differential CMOS input swings that have been deliberately skewed from perfect differential by 5 degrees at 1.6 GHz. The forward path and cross-coupled inverters "negotiate" on when to actually allow the output transitions to occur and the result is that the crossing voltage of waveforms 16, 18 are much closer in agreement than were the skewed input crossing voltages.

In addition, rediscovery of the N-path filtering technique has highlighted the emerging need for a technique to improve the pseudo-differential balance and duty cycle of 4-phase non-overlapping clocks.

Desirable in the art is an improved system and method for generating non-overlapping waveforms that would improve upon the conventional frequency conversion mixers.

SUMMARY

Systems and methods for improving the timing alignment of non-overlapping waveforms are provided. In this regard, a representative system, among others, includes a waveform synthesizer that generates a plurality of input waveforms and inverters having inputs and outputs, wherein the inverters receive the input waveforms at the inputs of the inverters and invert the input waveforms, producing a plurality of inverted waveforms at the outputs of the inverters. The system also includes NOR gates having inputs and outputs, wherein the NOR gates receive the plurality of inverted waveforms at the inputs of the NOR gates and pass through one of the inverted waveforms at the outputs of the NOR gates.

In this regard, a representative method, among others, includes generating a plurality of input waveforms; inverting the input waveforms, resulting in a plurality of inverted waveforms; passing through one of the plurality of inverted waveforms responsive to other_inverted waveforms of the plurality of inverted waveforms being at logic "0"; and combining the pass-through waveform and a first RF signal into an output signal.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Exemplary systems are first discussed with reference to the figures. Although these systems are described in detail, they are provided for purposes of illustration only and various modifications are feasible. After the exemplary systems are described, examples of flow diagrams of the systems are provided to explain the process for improving the timing alignment of non-overlapping waveforms with improved quality of timing of the waveforms. This disclosure is for use in improving the local oscillator drive signals into, for example, quadrature CMOS switching mixers that dominate the state of the art in frequency conversion.

Figure 3:
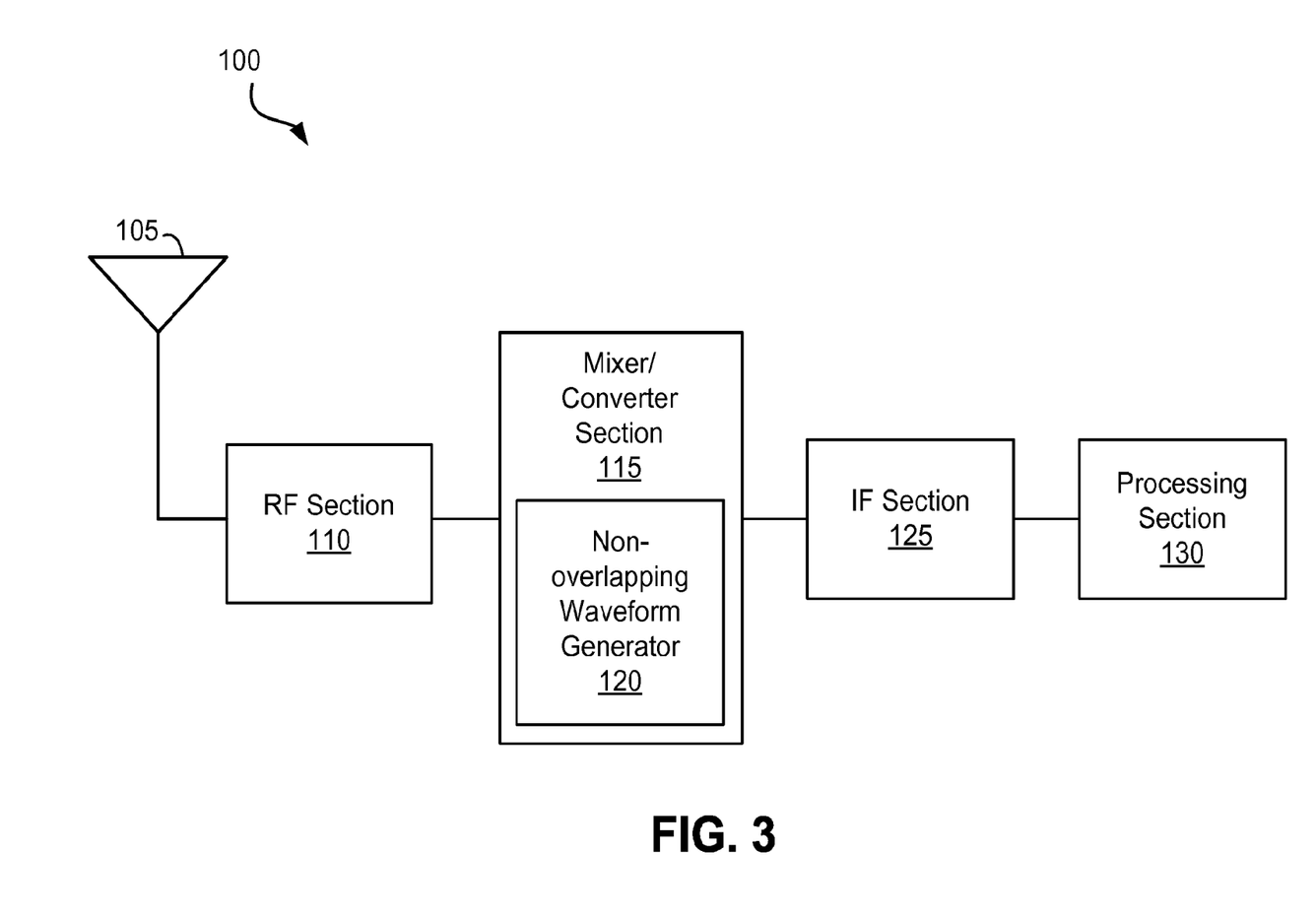
FIG. 3 is an overview of a system that generates non-overlapping waveforms with improved quality of timing in accordance to an embodiment of the present invention.

FIG. 3 is an overview of a system 100 for generating non-overlapping waveforms with improved quality of timing. The system 100 can be a radio frequency receiver, GPS receiver, any types of receiver, or electronic devices that include a receiver. The system 100 includes an antenna 105 that receives and passes radio frequency (RF) signals to an RF section 110. Said RF section 110 receives the RF signals from at least one antenna 105, and filters and amplifies the RF signals, among other well-known RF functionalities. A mixer/converter section 115 down-converts the filtered and amplified RF signals to intermediate frequency (IF) signals, wherein the mixer/converter section 115 includes a non-overlapping waveform generator 120, which is further described in FIGS. 4-8. An IF section 125 filters and amplifies the output signal and a processing section 130 processes the filtered and amplified output signal.

Figure 4:
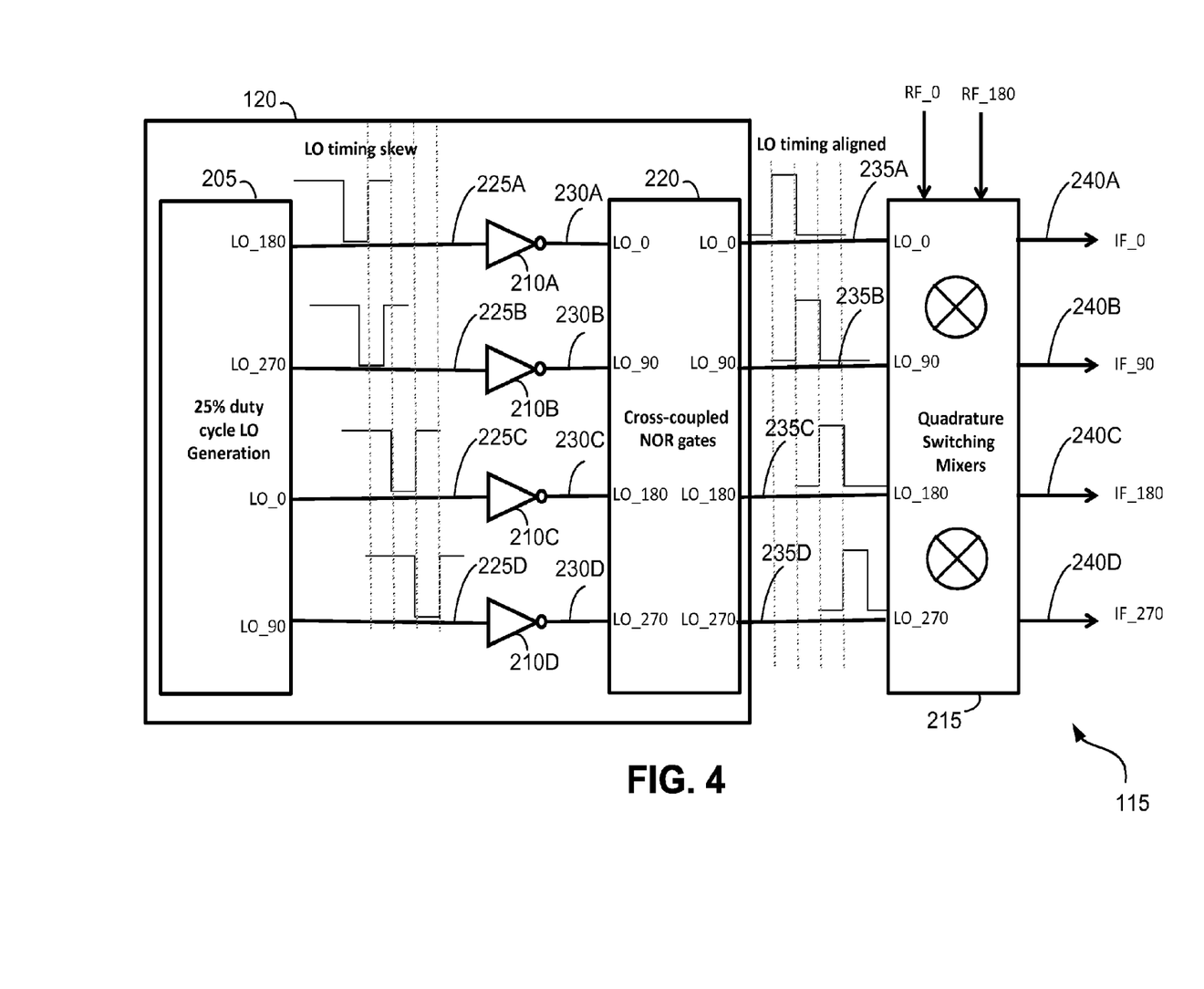
FIG. 4 is a diagram that depicts cross-coupled NOR gates used to de-skew quadrature LO clock waveforms prior to mixers for 25% duty cycle LO waveforms in accordance to an embodiment of the present invention.

FIG. 4 is a diagram that depicts a mixer/converter section 115 that includes cross-coupled NOR gates used to de-skew quadrature LO clock waveforms prior to mixers for 25% duty cycle LO waveforms. The mixer/converter section 115 includes a non-overlapping waveform generator 120, which can be a local oscillator. In this example, the generator 120 includes a waveform synthesizer 205 that generates a plurality of 25% duty cycle input waveforms at lines 225A-D, e.g., four 25% duty cycle input waveforms that are 180 degrees out of phase, 270 degrees out of phase, 0 degrees out of phase, and 90 degrees out of phase, respectively, with respect to the 0 degrees reference phase at line 230A.

Inverters 210A-D receive input waveforms at the inputs of the inverters from the waveform synthesizer 205 and invert the input waveforms, producing a plurality of inverted waveforms at the outputs of the inverters 210A-D at lines 230A-D, e.g., four 25% duty cycle inverted waveforms that are 0 degrees out of phase, 90 degrees out of phase, 180 degrees out of phase, and 270 degrees out of phase, respectively.

NOR gates 220 receive the plurality of inverted waveforms at the inputs of the NOR gates 220 and pass through one of the inverted waveforms at one of the outputs of the NOR gates 220 responsive to inverted waveforms of the plurality of inverted waveforms being at logic "0". In this example, the NOR gates 220 are cross-coupled NOR gates, receive the four 25% duty cycle inverted waveforms and pass through one of the four 25% duty cycle inverted waveforms responsive to the other three inverted waveforms being at logic "0".

Mixers 215 having inputs that receive the pass-through waveform and a first RF signal, e.g., RF_0, wherein the mixers 215 combine the pass-through waveform and the first RF signal into an output signal. Said output signal is outputted at one of lines 240A-D. Additionally or alternatively, the mixers 215 receive a second RF signal, e.g., RF_180, and combine the pass-through waveform, the first RF signal, and the second RF signal into a second output signal. Said second output signal is outputted at one of lines 240A-D, which in this example are four quadrature IF output signals (e.g., IF_0, IF_90, IF_180, and IF_270).

Figure 5:
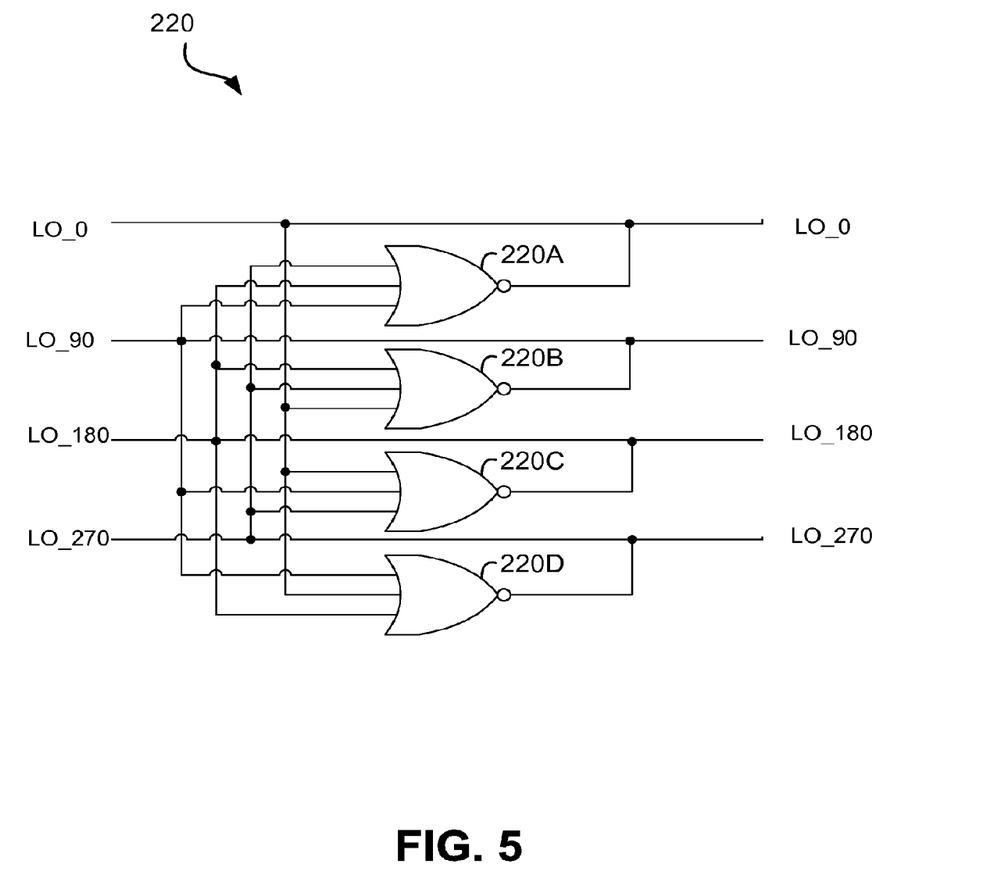
FIG. 5 is a diagram that depicts cross-coupled NOR gates for timing and duty cycle improvement in applications associated with the use of a 25% duty cycle LO waveforms in accordance to an embodiment of the present invention.
Figure 6:
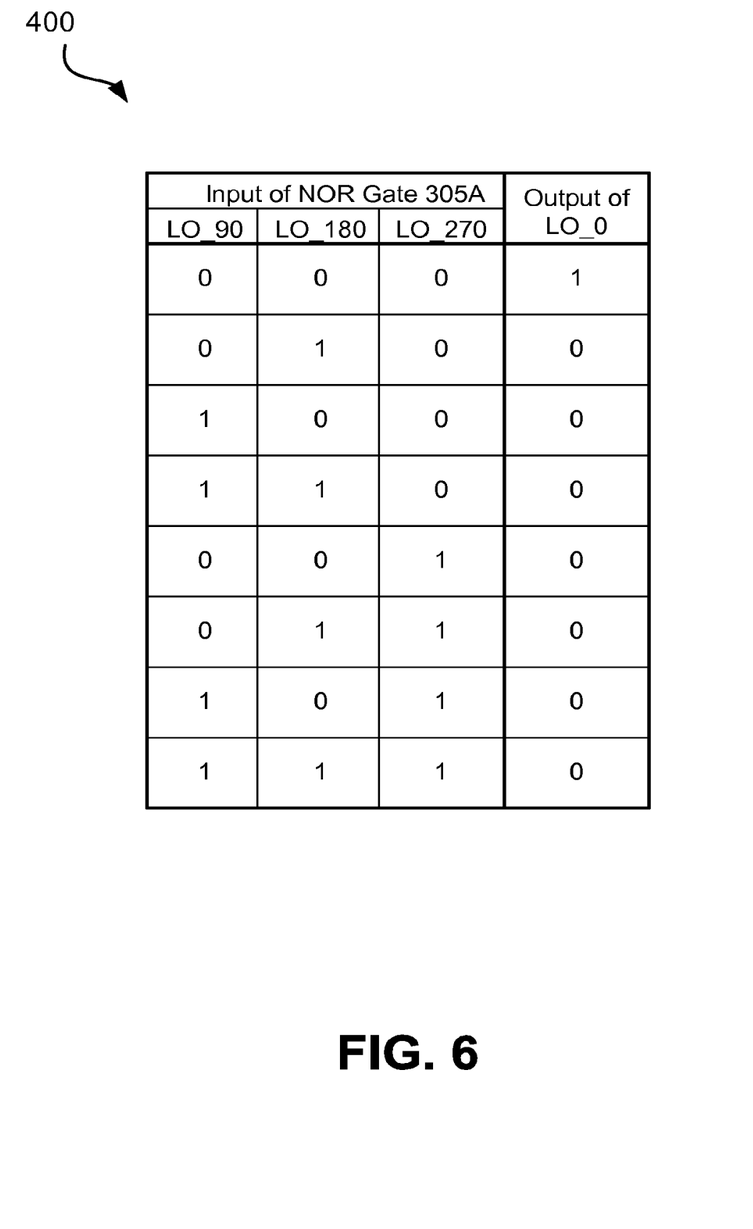
FIG. 6 depicts a truth table for NOR gates, such as that shown in FIG. 5.

FIG. 5 is a diagram that depicts cross-coupled NOR gates 220 for timing and duty cycle improvement in applications that are associated with the use of 25% duty cycle LO waveforms. In this example, cross-coupled NOR gates 220A-D having three (3) inputs such that each 25% duty cycle LO pulse is only allowed when the other three non-overlapping pulses are zero. A truth table 400 of NOR gate 220A in FIG. 6 shows a logic "1" being outputted only when the other three non-overlapping pulses are logic "0". One skilled in the art would appreciate that truth tables for NOR gates 220B-D are similar to the truth table shown in FIG. 6. As such, the truth tables for NOR gates 220B-D will not be shown and described.

Figure 7:
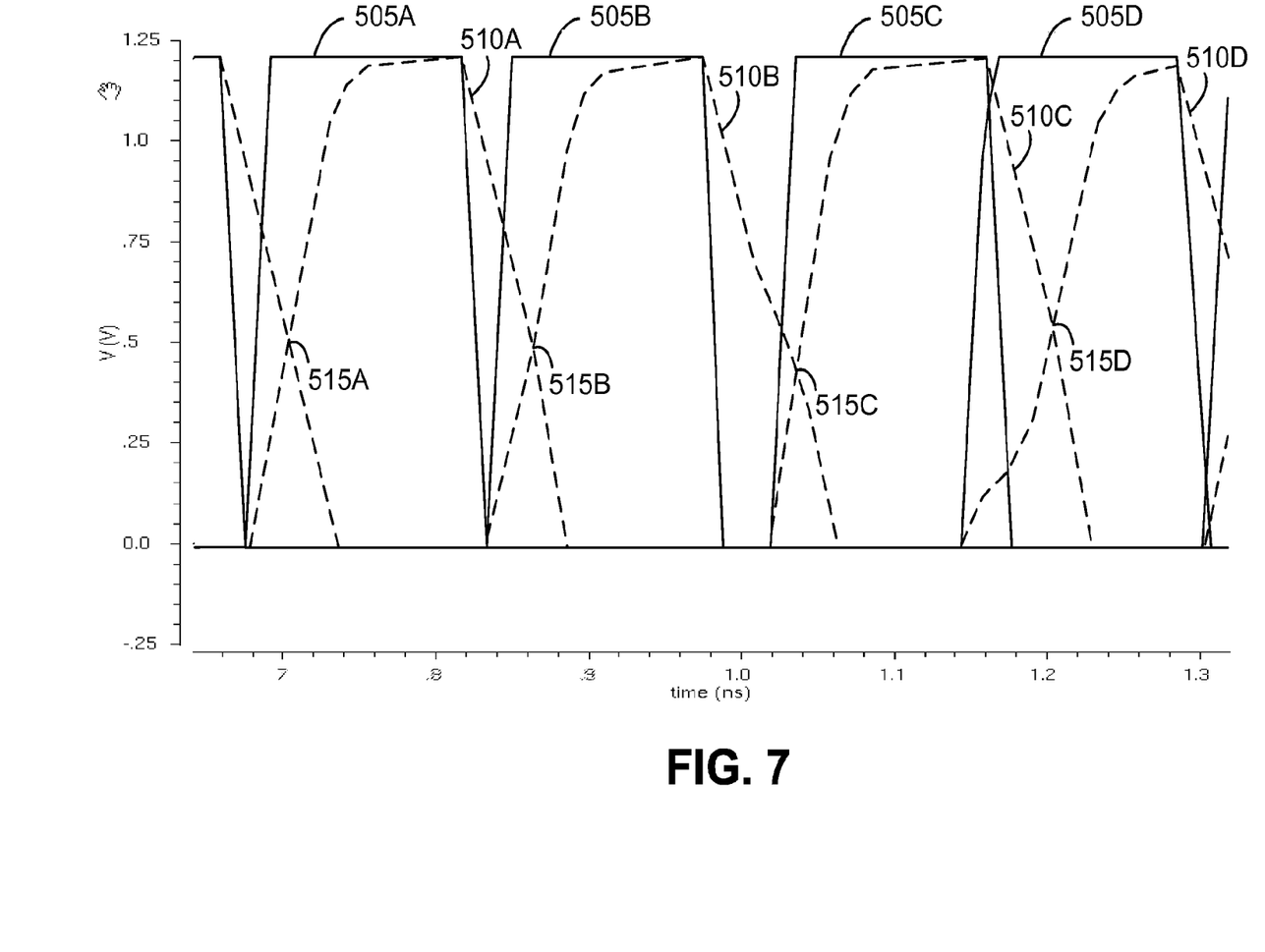
FIG. 7 depicts input waveforms that are de-skewed by cross-coupled NOR gates in accordance to an embodiment of the present invention.

FIG. 7 depicts input waveforms 505A-D at, for example, lines 230A-D (FIG. 4) and output waveforms 510A-D at, for example, lines 235A-D that are de-skewed by cross-coupled NOR gates 220A-D (FIG. 5). The cross-coupled NOR gates 220A-D produce the same "negotiation" as the inverters 9, 11 (FIG. 1) when presented with any skew in the timing of one of the 25% duty cycle LO pulses 505A-D. It should be noted that the 505C pulse was delayed by approximately 5 degrees, resulting in output waveforms 510C that have crossing voltages 515C that are much closer in agreement than the input crossing voltages due to the "negotiation" in transition time at approximately 0.5V, effected by the cross-coupled NOR gates 220A-D.

Figure 8:
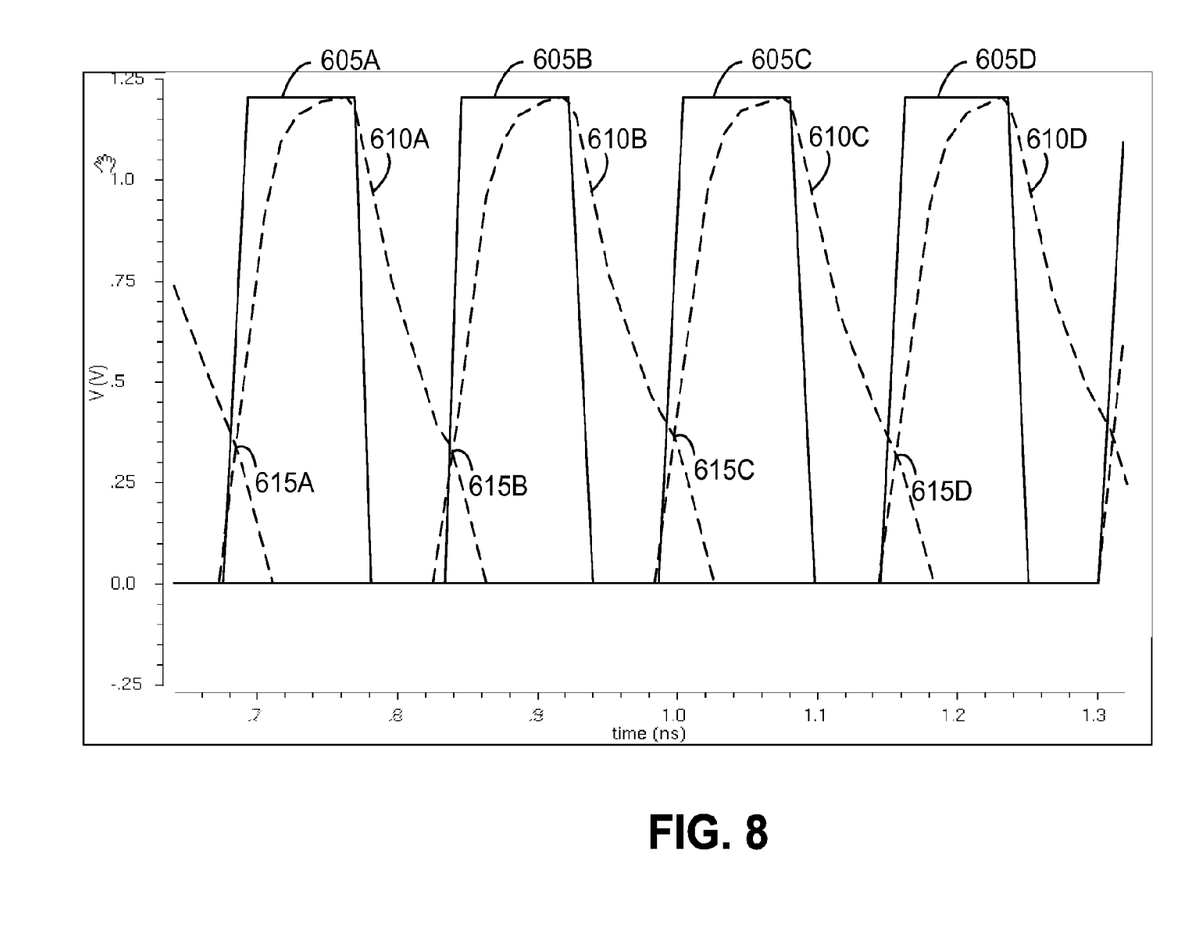
FIG. 8 depicts input waveforms that de-skewed by cross-coupled NOR gates in accordance to an embodiment of the present invention.

Other benefits, for example, are that if the input duty cycle gets significantly less than or greater than 25%, the circuit acts to maintain the output duty cycle close to 25%. For example, FIG. 8 depicts input waveforms 605A-D and output waveforms 610A-D that are de-skewed by cross-coupled NOR gates 220A-D. The input waveforms 605A-D are 17% input duty cycle waveforms, which were re-timed by the cross-coupled NOR gates 220A-D to produce 27% output duty cycles waveforms 610A-D with no timing skew included, a 4 times decrease in the duty cycle error relative to the 25% target, such as that shown in FIG. 7. The crossing voltages 615A-D of the output waveforms 610A-D are at approximately 0.4V.

Figure 9:
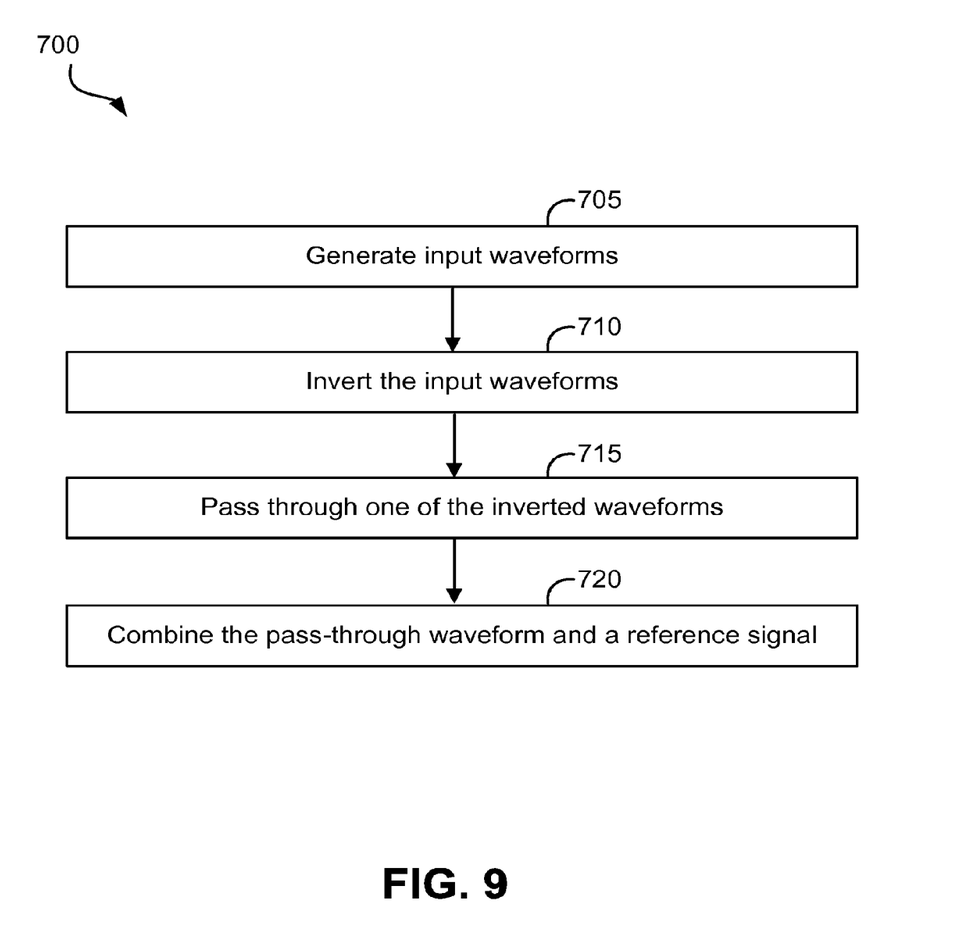
FIG. 9 is a flow diagram that illustrates an embodiment of the architecture, functionality, and/or operation of the system, such as that shown in FIG. 3, for improving the timing alignment of 25% duty cycle non-overlapping waveforms in accordance to an embodiment of the present invention.

FIG. 9 is a flow diagram 700 that illustrates an embodiment of the architecture, functionality, and/or operation of the system, such as that shown in FIG. 3, for generating non-overlapping waveforms. Beginning with step 705, a plurality of input waveforms are generated. For example, four 25% duty cycle input waveforms can be generated that are 180 degrees out of phase, 270 degrees out of phase, 0 degrees out of phase, and 90 degrees out of phase.

In step 710, the input waveforms are inverted, resulting in a plurality of inverted waveforms. For example, the four 25% duty cycle input waveforms can be inverted, resulting in four 25% duty cycle inverted waveforms that are 0 degrees out of phase, 90 degrees out of phase, 180 degrees out of phase, and 270 degrees out of phase.

In step 715, one of the plurality of inverted waveforms is passed through responsive to three inverted waveforms of the plurality of inverted waveforms being at logic "0". For example, one of the four 25% duty cycle inverted waveforms is passed through responsive to the other three inverted waveforms being at logic "0". In step 720, the pass-through waveform and a first RF signal are combined into an output signal. Additionally or alternatively, a second RF signal can be combined with the pass-through waveform and the first RF signal to produce a second output signal.

It should be noted that any process descriptions or blocks in flowcharts should be understood as representing modules, segments, or portions of code which include one or more executable instructions for implementing specific logical functions or steps in the process. In these alternate embodiments, functions may be executed out of order from that shown or discussed, including substantially concurrently or in reverse order, depending on the functionality involved.

This description has been presented for purposes of illustration and description. It is not intended to be exhaustive or to limit the disclosure to the precise forms disclosed. Obvious modifications or variations are possible in light of the above teachings. The embodiments discussed, however, were chosen to illustrate the principles of the disclosure, and its practical application. The disclosure is thus intended to enable one of ordinary skill in the art to use the disclosure, in various embodiments and with various modifications, as are suited to the particular use contemplated. All such modifications and variation are within the scope of this disclosure, as determined by the appended claims when interpreted in accordance with the breadth to which they are fairly and legally entitled.

Therefore, having thus described the disclosure, at least the following is claimed:

1. A system for improving the timing alignment of a non-overlapping waveforms comprising:
    a waveform synthesizer that generates a plurality of non-overlapping input waveforms;
    inverters having inputs and outputs, wherein the inverters receive the non-overlapping input waveforms at the inputs of the inverters and invert the non-overlapping input waveforms, producing a plurality of inverted non-overlapping waveforms at the outputs of the inverters; and
    NOR gates having inputs and outputs, wherein the NOR gates receive the plurality of inverted non-overlapping waveforms at the inputs of the NOR gates and pass through one of the inverted non-overlapping waveforms at the outputs of the NOR gates for improving the timing alignment of the inverted non-overlapping waveforms.

2. The system as defined in claim 1, wherein the NOR gates de-skew the received plurality of inverted non-overlapping waveforms.

3. The system as defined in claim 1, wherein the waveform synthesizer generates a plurality of duty cycle input waveforms that are in various degrees out of phase.

4. The system as defined in claim 3, wherein the inverters include a plurality of inverters that invert the plurality of duty cycle input waveforms, producing a plurality of duty cycle inverted waveforms that are in various degrees out of phase, respectively.

5. The system as defined in claim 4, wherein the NOR gates receive the plurality of duty cycle inverted waveforms and pass through one of the plurality of duty cycle inverted waveforms responsive to the other inverted waveforms being at logic "0".

6. The system as defined in claim 1, further comprising mixers having inputs that receive the pass-through non-overlapping waveform and a first radio frequency (RF) signal, wherein the mixers combine the pass-through non-overlapping waveform and the RF signal into an output signal the mixers receive a second RF signal and combine the pass-through non-overlapping waveform, the first RF signal, and the second RF signal into a second output signal.

7. The system as defined in claim 1, wherein the waveform synthesizer includes a local oscillator.

8. A receiver comprising:
    at least one antenna that receives radio frequency (RF) signals;
    an RF section that receives the RF signals from the at least one antenna, and filters and amplifies the RF signals;
    a mixer/converter section that down-converts the filtered and amplified RF signals to intermediate frequency (IF) signals, wherein the mixer/converter section includes a non-overlapping waveform generator that comprises:
        a waveform synthesizer that generates a plurality of non-overlapping input waveforms;
        inverters having inputs and outputs, wherein the inverters receive non-overlapping input waveforms at the inputs of the inverters and invert the non-overlapping input waveforms, producing a plurality of inverted non-overlapping waveforms at the outputs of the inverters; and
        NOR gates having inputs and outputs, wherein the NOR gates receive the plurality of inverted non-overlapping waveforms at the inputs of the NOR gates and pass through one of the inverted non-overlapping waveform at the outputs of the NOR gates responsive to three inverted non-overlapping waveforms of the plurality of inverted waveforms being at logic "0" for improving the timing alignment of the inverted non-overlapping waveforms; and
    an IF section that filters and amplifies the IF signal; and
    a processing section that processes the filtered and amplified IF signal.

9. The receiver as defined in claim 8, wherein the NOR gates de-skew the received plurality of inverted non-overlapping waveforms.

10. The receiver as defined in claim 8, wherein the waveform generator generates a plurality of duty cycle input waveforms that are in various degrees out of phase.

11. The receiver as defined in claim 10, wherein the inverters include four inverters that invert the four 25% duty cycle input waveforms, producing four 25% duty cycle inverted waveforms that are 0 degrees out of phase, 90 degrees out of phase, 180 degrees out of phase, and 270 degrees out of phase, respectively.

12. The receiver as defined in claim 8, wherein the NOR gates receive the four 25% duty cycle inverted non-overlapping waveforms and pass through one of the four 25% duty cycle inverted non-overlapping waveforms responsive to the other three inverted non-overlapping waveforms being at logic "0".

13. The receiver as defined in claim 8, wherein the mixer/converter section further comprising mixers having inputs that receive the pass-through non-overlapping waveform and a first RF signal, wherein the mixers combine the pass-through non-overlapping waveform and the first RF signal into an output signal the mixers receive a second RF signal and combine the pass-through non-overlapping waveform, the first RF signal, and the second RF signal into a second output signal.

14. The receiver as defined in claim 8, wherein the waveform synthesizer includes a local oscillator.

15. A method for improving the timing of non-overlapping waveforms, comprising:
    generating a plurality of non-overlapping input waveforms;
    inverting the non-overlapping input waveforms, resulting in a plurality of inverted non-overlapping waveforms;
    passing through one of the plurality of inverted non-overlapping waveforms responsive to other inverted waveforms of the plurality of inverted waveforms being at logic "0" for improving the timing alignment of the inverted non-overlapping waveforms; and
    combining the pass-through non-overlapping waveform and a first RF signal into an output signal.

16. The method as defined in claim 15, further comprising de-skewing the inverted non-overlapping waveforms.

17. The method as defined in claim 15, wherein generating the plurality of non-overlapping input waveforms includes generating a plurality of duty cycle input waveforms that are in various degrees out of phase.

18. The method as defined in claim 17, wherein inverting the non-overlapping input waveforms includes inverting the plurality of duty cycle input waveforms, resulting in a plurality of duty cycle inverted waveforms that are in various degrees out of phase.

19. The method as defined in claim 18, wherein passing through one of the plurality of inverted non-overlapping waveforms includes passing through one of the plurality of duty cycle inverted waveforms responsive to the other inverted waveforms being at logic "0".

20. The method as defined in claim 15, further comprising combining the pass-through non-overlapping waveform, the first RF signal, and a second RF signal into a second output signal.

* * * * *